(12) United States Patent
Nakajima et al.

(10) Patent No.: US 9,255,976 B2
(45) Date of Patent: Feb. 9, 2016

(54) CURRENT DETECTION DEVICE

(75) Inventors: Hirokatsu Nakajima, Yokkaichi (JP); Satoru Chaen, Yokkaichi (JP); Kouji Nishi, Yokkaichi (JP); Takashi Misaki, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 7 days.

(21) Appl. No.: 14/117,802

(22) PCT Filed: Oct. 24, 2011

(86) PCT No.: PCT/JP2011/074380
§ 371 (c)(1),
(2), (4) Date: Nov. 14, 2013

(87) PCT Pub. No.: WO2012/172701
PCT Pub. Date: Dec. 20, 2012

(65) Prior Publication Data
US 2014/0084914 A1    Mar. 27, 2014

(30) Foreign Application Priority Data

Jun. 15, 2011    (JP) .................. 2011-132953

(51) Int. Cl.
*G01R 15/20*    (2006.01)
*G01R 33/09*    (2006.01)
*G01R 31/00*    (2006.01)

(52) U.S. Cl.
CPC .............. *G01R 33/09* (2013.01); *G01R 15/207* (2013.01); *G01R 15/202* (2013.01); *G01R 31/006* (2013.01)

(58) Field of Classification Search
None
See application file for complete search history.

(56) References Cited

U.S. PATENT DOCUMENTS

| 5,831,425 A | 11/1998 | Ochiai |
| 6,008,634 A | 12/1999 | Murofushi et al. |

(Continued)

FOREIGN PATENT DOCUMENTS

| JP | A-6-130087 | 5/1994 |
| JP | A-H10-104279 | 4/1998 |

(Continued)

OTHER PUBLICATIONS

Machine English translation of Japanese Patent Publication to Inventor Takahashi Hara. JP 4507599 B, Jul. 21, 2010. Translation of pp. 2-12 created on Jan. 10, 2015.*

(Continued)

*Primary Examiner* — Melissa Koval
*Assistant Examiner* — Stephen G Armstrong
(74) *Attorney, Agent, or Firm* — Oliff PLC

(57) ABSTRACT

In a current detection device for detecting current in a busbar, a reduction in device size may be realized by employing a small magnetic core. The prevention or reduction of excessive heat generation by the busbar, the facilitation of the attachment task, and a reduction in the amount of space required for the attachment task may also be realized. The folded-back busbar is U-shaped with a bar-shaped penetration portion that passes through a hole portion of a magnetic core, two bar-shaped extension portions, and two flat plate-shaped penetration portions. The width of each terminal portion is larger than the widths of the penetration portion and the extension portions. An insulating casing supports the magnetic core, a Hall element, and the folded-back busbar in a fixed positional relationship, with the two terminal portions being exposed to the outside.

9 Claims, 8 Drawing Sheets

(56) References Cited

U.S. PATENT DOCUMENTS

2006/0119343 A1 6/2006 Saito et al.
2009/0128129 A1 5/2009 Aratani
2010/0090678 A1* 4/2010 Brunner et al. ............ 324/76.11

FOREIGN PATENT DOCUMENTS

| JP | A-2003-045231 | 2/2003 | | |
| JP | A-2006-166528 | 6/2006 | | |
| JP | A-2009-058451 | 3/2009 | | |
| JP | A-2009-128116 | 6/2009 | | |
| JP | 4507599 B2 * | 7/2010 | | |
| WO | WO 03056347 A1 * | 7/2003 | ............ | G01R 15/20 |

OTHER PUBLICATIONS

Machine English translation of International Patent Application Publication to Inventor Takahashi Hara et al. WO03056347A1, Jul. 10, 2003. Translation of pp. 1-19 created on Jul. 10, 2015.*

* cited by examiner

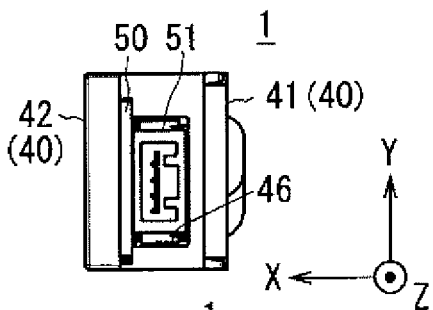
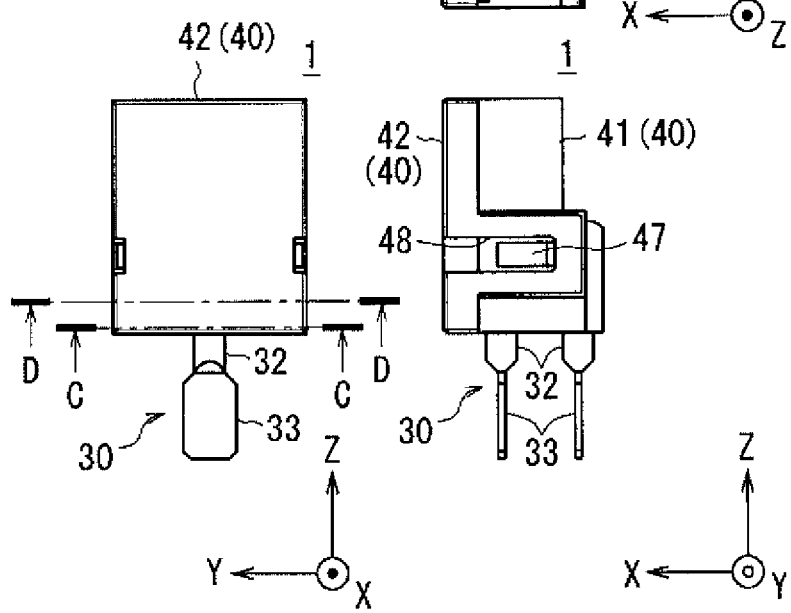
FIG. 2A  FIG. 2B
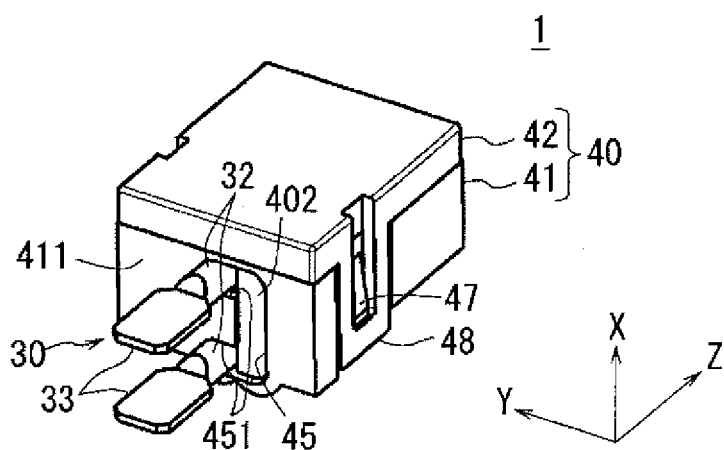
FIG. 3

FIG. 4A
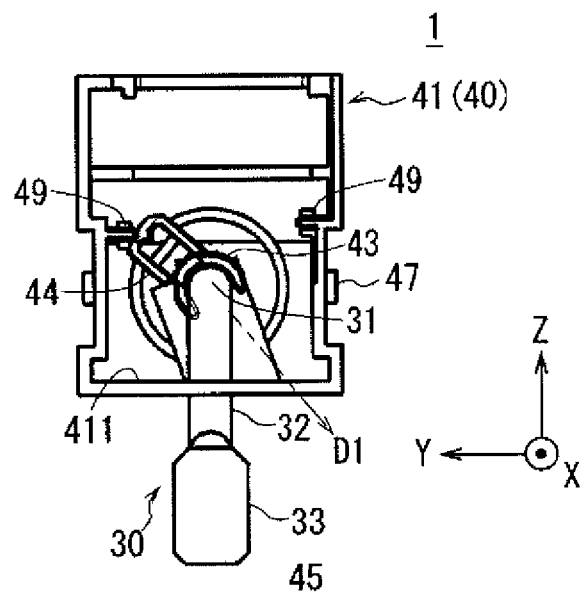
FIG. 4B
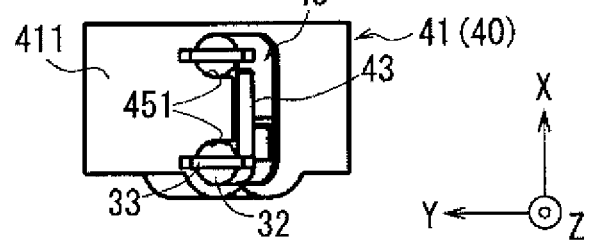
C-C
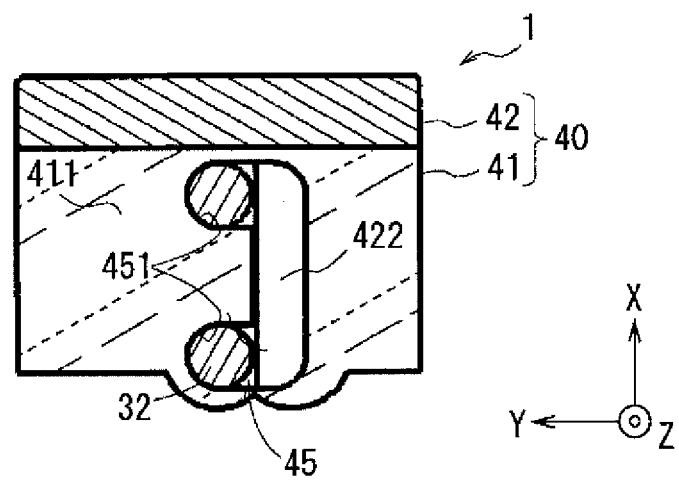
FIG. 5

CURRENT DETECTION DEVICE

BACKGROUND

This application is the national phase of PCT International Application No. PCT/JP2011/074380 that has an International filing date of Oct. 24, 2011 and designated the United States of America and claims priority to Japanese Patent App. No. JP2011/132953 that was filed on Jun. 15, 2011.

Some disclosed embodiments relate to a current detection device for detecting a current flowing through a busbar.

Some related art vehicles, such as hybrid automobiles and electric automobiles include a current detection device for detecting a current flowing through a busbar connected to a battery. Some exemplary current detection devices are a magnetic proportion-type current detection device and a magnetic balance-type current detection device.

The magnetic proportion type or the magnetic balance type current detection device include a magnetic core and a magneto-electric conversion element, as shown in JP H10-104279A, JP 2006-166528A, and JP 2009-58451A, for example. The magnetic core is a magnetic member substantially in the shape of a ring with a gap portion, resulting in two ends facing each other across the gap portion, and formed in one piece so as to surround a hole portion through which a busbar passes. The hole portion of the magnetic member is a space through which the current that is to be detected flows.

Also, in related art current detection devices, the magnetic core is structured such that multiple thin plate-shaped members, each of which is substantially ring-shaped and made of a magnetic material, are stacked with an adhesive material placed between them. Hereinafter, a magnetic core having this kind of structure will be referred to as a stacked-type magnetic core.

Furthermore, the magneto-electric conversion element is disposed in the gap portion of the magnetic core, and is an element that detects magnetic flux that changes in accordance with the current that flows through the busbar disposed so as to pass through the hole portion, and then outputs a magnetic flux detection signal as an electrical signal. A Hall element is typically used as the magneto-electric conversion element.

Also, as disclosed in JP 2009-128116A, in current detection devices, the magnetic core and the magneto-electric conversion element are in many cases supported in a fixed positional relationship by an insulating casing. The multiple components constituting the current detection device are positioned in a fixed positional relationship by this casing. Note that the casing is generally constituted using an insulating resin member.

Also, as disclosed in JP S57-39902A, in an electrical junction box for vehicle mounting, for example, an electrical part and a busbar may be electrically connected via junction terminals constituted by conductors.

Two junction terminals are respectively electrically connected to an anterior busbar and a posterior busbar in the electrical junction box, and a connection port for the insertion of a terminal portion of the electrical part is formed in each junction terminal. Two terminal portions shaped as plates that protrude from the electrical part in the same direction are then simply inserted into the connection ports of the two junction terminals, thus being clamped and held by the two junction terminals. The two terminal portions of the electrical part are thus electrically connected to the anterior and posterior busbars via the two junction terminals.

If the electrical part is provided with two terminal portions shaped as plates that protrude in the same direction, the terminal portions are electrically connected to the busbars with the simple operation of inserting them into the connection ports of the two junction terminals that have been provided in advance.

SUMMARY

It may be beneficial for current detection devices for vehicle mounting to provide size reduction and weight reduction, and to facilitate attachment.

However, since the plate-shaped busbar of related art current detection devices is inserted into the hole portion of the magnetic core, the magnetic core needs to be formed such that the largest width (diameter) of the hole portion is larger than the width of the busbar. Meanwhile, in electric automobiles, hybrid automobiles, and the like, wider busbars are being employed in order to prevent excessive heat generation of the busbar that accompanies the increase in current flowing through the busbar.

Accordingly, as the width of the busbar increases in related art current detection devices, the size of the magnetic core that is needed increases proportionally to the width of the busbar, and this has problems such as an increase in the device size and an increase in the amount of space required for installation. In particular, in the case where the magnetic core is shaped as a circular ring, an elliptical ring, or a rectangular ring that's ratio of the vertical dimension to the horizontal dimension is 1 or close to or approximately 1, the larger the width of the busbar is, the greater the amount of needless space there is in the hole portion of the magnetic core.

Also, related art current detection devices need to be fixed using a complicated task such as screw-fixing, and there is demand for an easier attachment task and a reduction in the amount of space required for the attachment task.

Some embodiments are therefore directed to a current detection device that detects a current flowing through a busbar, reduce device size by employing a relatively small magnetic core, and also reduce or prevent excessive heat generation by the busbar, facilitate attachment, and reduce the amount of space required for the attachment task.

A current detection device according to a first embodiment is described below.

In one aspect, a magnetic core that is made of a magnetic material and is formed in one piece so as to define a hole portion and a gap portion. The magnetic core having two ends facing each other across the gap portion.

In another aspect, a magneto-electric conversion element is disposed in the gap portion of the magnetic core and detects magnetic flux that changes in accordance with current flowing through the hole portion of the magnetic core.

In another aspect, a current detection busbar that is made of a conductor and passes through the hole portion of the magnetic core. Wherein the current detection busbar is formed in an overall U shape, and has a bar-shaped penetration portion that passes through the hole portion of the magnetic core along a first direction. The current detection busbar also has two bar-shaped extension portions that are respectively continuous with front and back sides of the penetration portion in the first direction, and extend parallel to a second direction that is orthogonal to the first direction, and two terminal portions that are respectively continuous with the two extension portions on sides in the second direction, and are shaped as flat plates having a larger width than the penetration portion and the extension portions.

A current detection device according to a second embodiment includes the current detection device of the first embodiment, as well as the constituent component described below.

In another aspect of the invention, an insulating casing that is made of an insulating material, covers the magnetic core, the magneto-electric conversion element, the penetration portion, and a portion of each of the two extension portions of the current detection busbar. The two terminal portions extend outside of the insulating casing. The insulating casing supports the magnetic core, the magneto-electric conversion element, and the current detection busbar in a fixed positional relationship. A current detection device according to a third embodiment includes the features of the second embodiment, as well as the features described below. In another aspect of the invention, the gap portion is larger than the thickness of each of the two extension portions of the current detection busbar. The insulating casing further includes a box member having an opening formed in the first direction, and a cover member that closes the opening of the box member when combined with the box member. The box member includes a bottom wall that forms a wall on an end in the second direction (the bottom wall formed in one piece so as to define a through-hole into which the current detection busbar can be inserted). The box member also includes a semi-tubular support portion that is positioned with the first direction as an axial direction. The semi-tubular support portion supports the magnetic core with an outer face and supports the current detection busbar with an inner face inserted between an inner periphery of the magnetic core and the penetration portion of the current detection busbar in the hole portion of the magnetic core. The box member also includes a rotation prevention protruding portion is formed on the cover member so as to protrude along the first direction, the rotation prevention protruding portion restricting rotation of the current detection busbar upon coming into contact with an extension portion of the current detection busbar supported by the semi-tubular support portion.

A current detection device according to a fourth embodiment is one aspect of the current detection device according to the third embodiment including the features described below. In another aspect of the invention, the penetration portion of the current detection busbar is shaped as a circular column. And, the semi-tubular support portion of the box member is shaped as a semicircular tube.

A current detection device according to a fifth embodiment is one aspect of the current detection device according to the third embodiment or the fourth embodiment further including the features described below. In another aspect of the invention, the through-hole defines two cutout portions that are recessed in a third direction that is orthogonal to the first direction and the second direction and respectively allow the two extension portions of the current detection busbar to be fitted therein are formed in the periphery of the through-hole in the bottom wall of the box member. And an obstructing plate is formed on the cover member so as to protrude along the first direction (the obstructing plate blocks a region of the through-hole in the bottom wall of the box member that excludes a region occupied by the two extension portions fitted into the cutout portions).

Also, a current detection device according to a sixth embodiment is one aspect of the current detection device according to any of the first to fifth embodiment where the two terminal portions are shaped as flat plates that conform to two orthogonal planes.

Also, a current detection device according to a seventh embodiment is one aspect of the current detection device according to any of the first to sixth embodiment. In the current detection device according to the seventh embodiment, the current detection busbar is formed by two end portions of a bar-shaped metal member passing through the hole portion of the magnetic core. The end portions are flattened by press processing so as to be shaped as flat plates having a larger width than other portions, and the two flattened end portions constitute two terminal portions.

Hereinafter, the following terminology will be used. A first direction is the direction in which the current detection busbar passes through the hole portion of the magnetic core (current flow direction). A second direction is the direction in which the terminal portions of the current detection busbar protrude from the penetration portion via the two extension portions; this second direction is orthogonal to the first direction. The third direction is the direction orthogonal to both the first direction and the second direction.

In the current detection device according to the first embodiment, the two end portions of the current detection busbar are the terminal portions. Specifically, in the state of passing through the hole portion of the magnetic core, the current detection busbar can be connected, from the rear, to anterior and posterior busbars provided in advance. This enables employing an irregular current detection busbar whose shape is different from that of the anterior and posterior busbars, and enables employing a small-sized magnetic core without being constrained by the width of the anterior and posterior busbars.

Also, in the current detection busbar, the bar-shaped penetration portion is formed with a thickness larger than the terminal portions at the two ends, and therefore the penetration portion can be formed with more surface area while being constrained to having a width and thickness that are smaller than the width of the hole portion of the magnetic core. Accordingly, it is possible to prevent excessive heat generation by the current detection busbar even when employing a relatively small magnetic core.

Also, the current detection device according to the first embodiment includes two terminal portions shaped as flat plates that protrude in the same direction. For this reason, with the simple operation of inserting the two terminal portions into connection ports of two junction terminals provided in advance, the current detection busbar is electrically connected to the anterior and posterior busbars via the two junction terminals, and also fixed to the junction terminals. In other words, the attachment task for connecting the current detection device according to the first embodiment to existing busbars is simple.

Also, the dimension of the current detection device according to the first embodiment in the first direction need only be a small dimension that is approximately the dimension obtained by adding the diameters of the two extension portions of the current detection busbar to the thickness of the magnetic core. Also, the dimension of the current detection device according to the first embodiment in the third direction need only be a small dimension that is approximately the width of the magnetic core. In other words, the projected surface area of the current detection device according to the first embodiment in the second direction can be small. Moreover, the current detection device according to the first embodiment is attached to the junction terminals by merely being inserted into the junction terminals along the second direction, and there is no need for surplus workspace for a screwing-fixing task or the like. Accordingly, employing the current detection device according to the first embodiment enables reducing the amount of space required for the attachment task.

Also, in the second embodiment, the constituent components of the current detection device are held in a predetermined positional relationship by the insulating casing that covers everything except the two terminal portions that are to be exposed. Accordingly, with the second embodiment, the task for attaching the current detection device to the junction terminals provided in advance is easy. Moreover, the insulating casing prevents the entrance of foreign matter into the gap between the magnetic core and the magneto-electric conversion element, thus making it possible to avoid degradation in current detection precision due to the entrance of foreign matter.

Also, according to the third embodiment, due the insulating casing having a relatively simple structure composed of two members, it is possible to cover and position the magnetic core and the current detection busbar, as will be described later.

Also, according to the fourth embodiment, the penetration portion of the current detection busbar can be smoothly supported to the semi-tubular support portion, as will be described later.

Also, according to the fifth embodiment, the gap between the insulating casing and the two extension portions of the current detection busbar is blocked, the entrance of foreign matter into the insulating casing is more reliably prevented, and it is possible to more reliably avoid degradation in current detection precision due to the entrance of foreign matter.

Also, according to the sixth embodiment, it is possible to avoid a failure in the connection between the terminal portions and the junction terminals through having dimensional tolerance between the two terminal portions and the junction terminals to which they are to be connected, as will be described later.

Also, according to the seventh embodiment, flat plate-shaped terminal portions having a larger width than the width of the hole portion of the magnetic core can be easily formed in the two end portions of the bar-shaped metal member that is not plate-shaped.

BRIEF DESCRIPTION OF THE DRAWINGS

FIG. 2a through FIG. 2c are three-view diagrams of the current detection device 1.

FIG. 3 is a perspective view of the current detection device 1 from the bottom face side.

FIG. 4a and FIG. 4b are a front view and a bottom view respectively of a box member and a current detection busbar supported therein, in the current detection device 1.

FIG. 5 is a first cross-sectional view of the current detection device 1.

DETAILED DESCRIPTION OF THE EMBODIMENTS

Hereinafter, an embodiment of the present invention will be described with reference to the accompanying drawings. The following embodiment is merely a specific example of the present invention, and is not to restrict the technical scope of the present invention.

Figure 6:
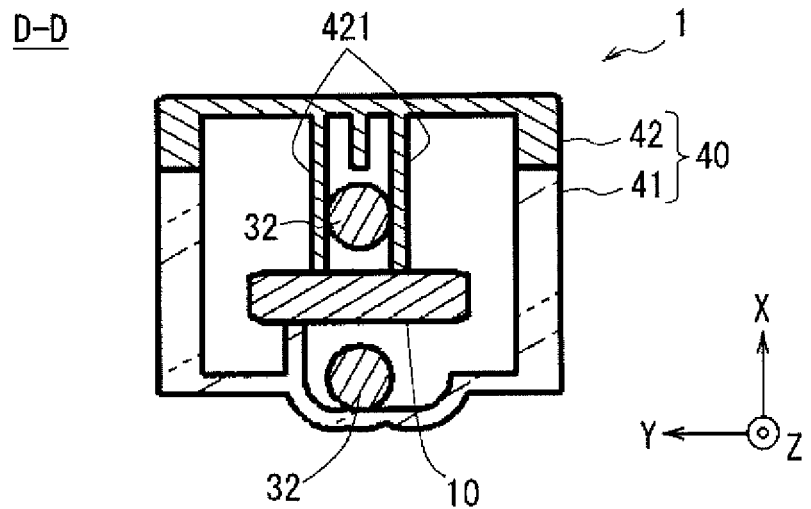
FIG. 6 is a second cross-sectional view of the current detection device 1.

First, the configuration of a current detection device 1 according to an embodiment of the present invention will be described with reference to FIGS. 1 to 6. Note that FIG. 2(a) is a front view, FIG. 2(b) is a side view, and FIG. 2(c) is a plan view. Also, FIG. 4(a) is a front view, and FIG. 4(b) is a bottom view. Moreover, FIG. 5 is a cross-sectional view taken along C-C shown in FIG. 2(a), and FIG. 6 is a cross-sectional view taken along D-D shown in FIG. 2(b).

Figure 1:
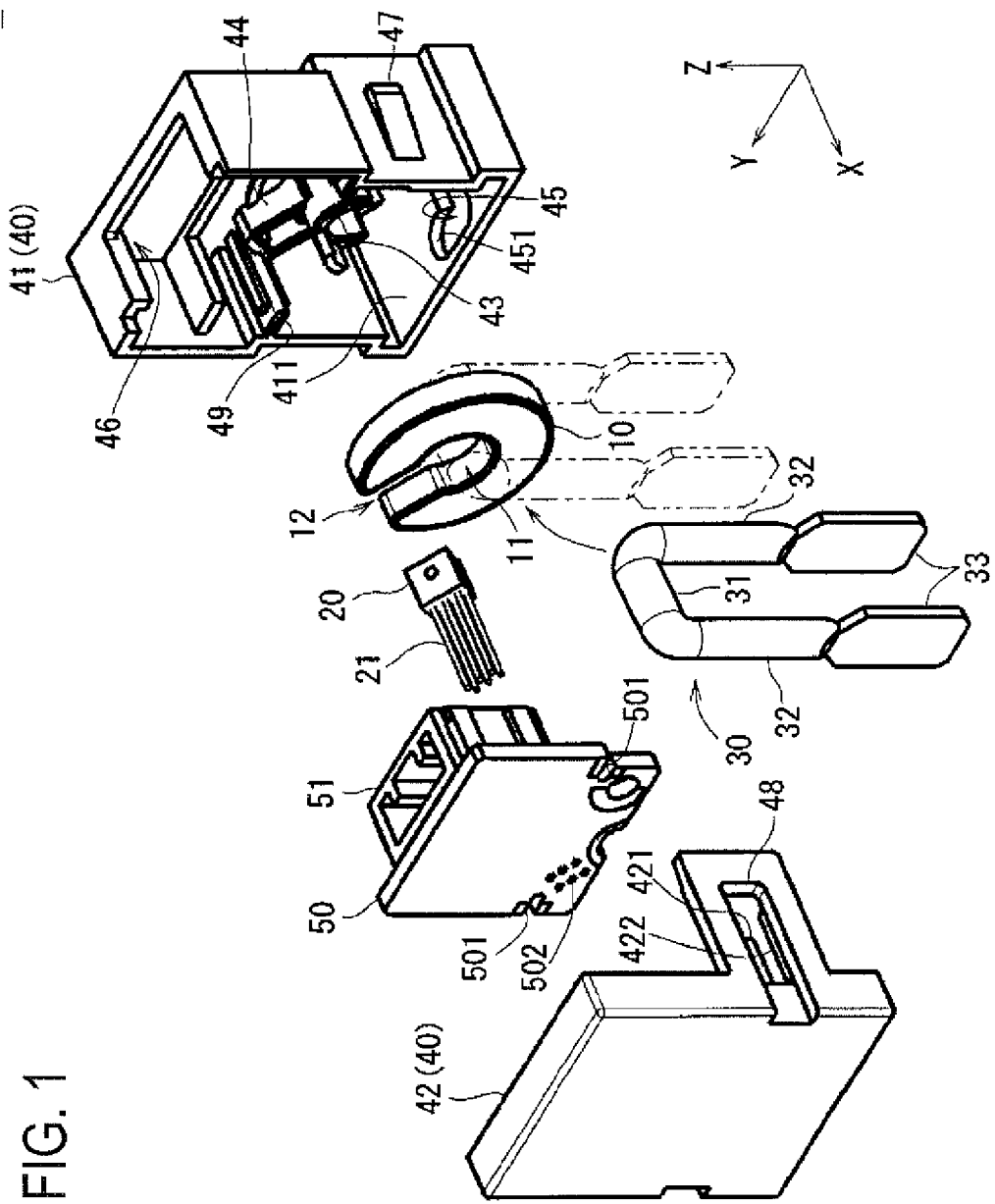
FIG. 1 is an exploded perspective view of a current detection device 1 according to an embodiment of the present invention.

The current detection device 1 is a device for detecting a current flowing through a busbar that electrically connects a battery and a device such as a motor in an electric automobile, a hybrid automobile, or the like. As shown in FIG. 1, the current detection device 1 includes a magnetic core 10, a Hall element 20, a folded-back busbar 30, an insulating casing 40, and an electronic circuit board 50.

<Magnetic Core>

The magnetic core 10 is a member (magnetic member) made of a magnetic material such as permalloy, ferrite, or silicon steel. The magnetic core 10 is a member molded by sintering a powder made of a magnetic material, for example. This magnetic core 10 is a member obtained as a result of an aggregate of a solid powder made of a magnetic material being compressed in a mold form and then solidified and molded by being heated to a temperature lower than the melting point of the magnetic body material. Alternatively, the magnetic core 10 may be a stacked-type magnetic core.

Also, the magnetic core 10 is in a shape formed in one piece so as to surround a hole portion 11 with two ends of the magnetic core 10 facing each other across a gap portion 12 having a size of approximately several millimeters. That is to say, the magnetic core 10 is formed substantially in the shape of a ring except that it has the narrow gap portion 12. The magnetic core 10 of the present embodiment is formed substantially in the shape of a circular ring that surrounds the circular hole portion 11.

<Hall Element (Magneto-Electric Conversion Element)>

The Hall element 20 is disposed in the gap portion 12 of the magnetic core 10, and is an example of a magneto-electric conversion element for detecting magnetic flux that changes in accordance with the current flowing through the hole portion 11 of the magnetic core 10, and then outputting a magnetic flux detection signal as an electrical signal. Connection terminals 21 for the input of power and the output of the detection signal are formed so as to extend out from the Hall element 20.

With the Hall element 20, the predetermined detection center is positioned on a line that connects the centers of projection planes of the two opposing end portions of the magnetic core 10, and the top and bottom faces are disposed so as to be orthogonal to the direction of magnetic flux formed in the gap portion 12. The detection center of the Hall element 20 is normally substantially the center of the Hall element 20.

In the example shown in FIG. 1, the current detection device 1 includes two Hall elements 20, and the two Hall elements 20 are disposed so as to overlap each other in the gap portion 12 of the magnetic core 10. The detection signals output by the two Hall elements 20 are each input to a control portion (not shown) provided separately from the current detection device 1. This control portion determines whether or not an abnormality has occurred in either of the two Hall elements 20 by comparing the two detection signals. Note that it is conceivable for the current detection device 1 to include only one Hall element 20 disposed in the gap portion 12 of the magnetic core 10.

<Electronic Circuit Board>

The electronic circuit board 50 is a board having mounted thereon a circuit that is electronically connected to the connection terminals 21 of the Hall element 20, and a connector 51 for connecting this circuit and another external circuit. Accordingly, the connector 51 is electrically connected to the Hall element 20. Examples of circuits mounted on the electronic circuit board 50 include a circuit for adjusting the current supplied to the Hall element 20, and a circuit for amplifying the magnetic flux detection signal output from the Hall element 20. The Hall element 20 is connected to an external circuit such as the control portion via the electronic circuit board 50 that includes the connector 51.

Also, a notch portion 501 is formed on two sides of the periphery of the electronic circuit board 50. As will be described later, the notch portions 501 of the electronic circuit board 50 are supported by the insulating casing 40.

<Current Detection Busbar>

The folded-back busbar 30 is a conductor made of a metal such as annealed copper or aluminum, and is a portion of the busbar for electrically connecting a primary-side device such as a battery or an inverter circuit and a secondary-side device such as a motor. In other words, the folded-back busbar 30 is a current detection busbar for detecting a detection-target current flowing through it. Also, the folded-back busbar 30 is a member that is independent from an anterior busbar that is connected to the primary-side device in advance and a posterior busbar that is connected to the secondary-side device in advance.

Junction terminals are connected to end portions of the anterior and the posterior busbars, and the anterior and posterior busbars are laid out in advance along with junction terminals in an electrical junction box or the like. The two end portions of the folded-back busbar 30 are connected to the junction terminals of the anterior and posterior busbars laid out in advance. The folded-back busbar 30 and the other busbars, namely the anterior and posterior busbars connected thereto, form a current transmission path that extends from the battery to an electrical device.

As shown in FIG. 1, the folded-back busbar 30 is a member formed in an overall folded-back shape, and is disposed so as to pass through the hole portion 11 of the magnetic core 10. Note that the folded-back busbar 30 passing through the hole portion 11 of the magnetic core 10 is depicted with virtual lines (dashed double-dotted lines) in FIG. 1.

The folded-back busbar 30 is configured by a bar-shaped penetration portion 31, two bar-shaped extension portions 32, and two terminal portions 33 formed in the shape of flat plates. More specifically, the folded-back busbar 30 is a member made of a conductor that has a bar-shaped penetration portion 31 that occupies a certain range in the central portion, two bar-shaped extension portions 32 that are formed so as to be continuous with the penetration portion 31 on respective sides thereof in the direction of passing through the hole portion 11, and two terminal portions 33 that are respectively formed so as to be continuous with the two extension portions 32.

The penetration portion 31 is a bar-shaped portion that passes through the hole portion 11 of the magnetic core 10 along the current flow direction, and the cross-sectional shape of the penetration portion 31 is not a flattened shape. The current flow direction is the thickness direction of the magnetic core 10, and if the ring-shaped magnetic core 10 were considered to be a cylinder, it would be the axial direction of the cylinder. Furthermore, it is a direction orthogonal to the plane formed by the ring-shaped magnetic core 10. In the figures, the current flow direction is indicated as the X-axis direction. In the following description, the current flow direction (the X-axis direction) is referred to as the first direction.

The two extension portions 32 are bar-shaped members that are continuous with the penetration portion 31 on the front and back sides thereof in the first direction, and extend parallel to a direction orthogonal to the first direction. In other words, the folded-back busbar 30 is formed so as to be bent at an angle of 90° at boundary portions between the penetration portion 31 and the two extension portions 32. In the drawings, the direction along the lengthwise direction of the two extension portions 32 is indicated as the Z-axis direction. Also, in the figures, the direction orthogonal to the X-axis direction and the Z-axis direction is indicated as the Y-axis direction. In the following description, the direction in which the two extension portions 32 extend from the penetration portion 31 (Z-axis negative direction) is referred to as the second direction. Also, the direction orthogonal to the first direction and the second direction is referred to as the third direction (Y-axis direction).

The two terminal portions 33 are portions that are respectively continuous, on a side in the second direction, with the two extension portions 32, and are formed in the shape of flat plates with a larger width than the penetration portion 31 and the extension portions 32.

The penetration portion 31 and the extension portions 32 of the folded-back busbar 30 are formed in the shape of a bar such as a circular column, an elliptical column, or a prism. In the present embodiment, the penetration portion 31 and the extension portions 32 of the folded-back busbar 30 each have a circular column shape.

On the other hand, the two terminal portions 33 are both formed in the shape of flat plates with a larger width than the penetration portion 31 and the extension portions 32. Also, the penetration portion 31 and the extension portions 32 are formed with a larger thickness than each of the two terminal portions 33.

The folded-back busbar 30 is a member obtained by, for example, performing press processing on two end portions of a bar-shaped conductor that can pass through the hole portion 11 of the magnetic core 10. In this case, the two end portions subjected to press processing become the two terminal portions 33 for connection with connection ends of the anterior and posterior busbars of the current transmission path.

The folded-back busbar 30 is a member having a structure formed as a result of the two end portions of a bar-shaped metal member that can pass through the hole portion 11 of the magnetic core 10 being flattened by press processing into the shape of a flat plate having a larger width than the other portions. The two end portions flattened by press processing constitute the two terminal portions 33 of the folded-back busbar 30.

The bar-shaped metal member serving as the member for forming the folded-back busbar 30 is molded into a folded-back shape in advance, for example. The folded-back busbar 30 is then manufactured by the two end portions of the metal member being molded into the shape of a plate having a larger width than the other portions by pressing processing.

Alternatively, the metal member serving as the member for forming the folded-back busbar 30 may be a straight bar-shaped member. In this case, the two end portions of the straight bar-shaped metal member are molded into the shape of a plate having a larger width than the other portions by press processing, and then the metal member is bent at two places on respective sides of the central portion. The folded-back busbar 30 may be manufactured using such a procedure.

The folded-back busbar 30 is formed such that the width of each of the two terminal portions 33 is larger than the diameter (width) of the hole portion 11 of the magnetic core 10. Also, the penetration portion 31 and the extension portions 32 are formed with a larger thickness (diameter) than the thickness of the flattened terminal portions 33. In other words, the ratio of the vertical dimension to the horizontal dimension of the outline of the cross-sections of the penetration portion 31 and the extension portions 32 is closer to 1 than the ratio of the vertical dimension to the horizontal dimension of the cross-section of the flattened terminal portions 33. Note that in the case where the penetration portion 31 is shaped as a circular column, the thickness and width of the penetration portion 31 are the same. The same follows for the extension portions 32. Here, the ratio being closer to 1 includes the case where the ratio is 1.

Also, in the present embodiment, the thickness of the penetration portion 31 and the extension portions 32 is smaller than the gap between the two ends of the magnetic core 10. Note that the gap between the two ends of the magnetic core 10 refers to the height of the gap portion 12 of the magnetic core 10.

<Insulating Casing>

The insulating casing 40 is a member that is made of an insulating material, and supports the magnetic core 10, the Hall element 20, the folded-back busbar 30, and the electronic circuit board 50 in a fixed positional relationship. The insulating casing 40 is composed of a box member 41 and a cover member 42 that is combined with the box member 41. The box member 41 and the cover member 42 are, for example, each a monolithic molded member made of insulating resin such as polyamide (PA), polypropylene (PP), polybutylene terephthalate (PBT), or ABS resin.

The box member 41 is a box-shaped member having an opening formed in the first direction (X-axis positive direction). Specifically, the box member 41 is a member having walls formed in five out of the six directions up, down, left, right, forward, and backward, with no wall being formed in the first direction. The cover member 42, on the other hand, is a member that closes the opening of the box member 41 when combined with the box member 41.

A bottom wall 411 of the box member 41 forms the wall on end in the second direction (Z-axis negative direction). As shown in FIGS. 3, 4(b), and 5, the bottom wall 411 is provided with a busbar hole 45, which is a through-hole that allows the insertion of a portion of the folded-back busbar 30 that spans from the penetration portion 31 to a portion of each of the two extension portions 32.

Also, two cutout portions 451 that are recessed in the third direction (Y-axis positive direction) and respectively allow the two extension portions 32 of the folded-back busbar 30 to be fitted therein are formed in the periphery of the busbar hole 45 in the bottom wall 411 of the box member 41. The cutout portions 451 are formed in a shape that conforms to the outer peripheral shape of the extension portions 32. In the present embodiment, the extension portions 32 are shaped as circular columns, and therefore the cutout portions 451 are formed in the shape of circular arcs that conform to the outer circumferential faces of the extension portions 32.

Also, a protruding first support portion 43 and a protruding second support portion 44 are formed on an inner face of the box member 41. The magnetic core 10, the folded-back busbar 30 passing through the hole portion 11, and the Hall element 20 disposed in the gap portion 12 are supported by the first support portion 43 and the second support portion 44 of the box member 41 so as to be in a fixed positional relationship of not being in contact with each other. This will be described in detail later.

More specifically, as shown in FIGS. 1 and 4(a), the first support portion 43 is formed in a semi-tubular shape having the first direction as its axial direction. Free portions of the side faces of the semi-tubular first support portion 43 are formed so as to face a direction orthogonal to the second direction. For example, as shown in FIG. 6, the free portions of the side faces of the semi-tubular first support portion 43 are formed so as to face a direction D1 between the second direction (Z-axis negative direction) and the third direction (Y-axis positive direction or negative direction). In the present embodiment, the direction D1 of the free portions of the side faces of the semi-tubular first support portion 43 is a direction between the Z-axis negative direction and the Y-axis negative direction.

The inner face of the first support portion 43 is formed in a shape that conforms to the outer circumferential face of the penetration portion 31 of the folded-back busbar 30. Also, the outer face of the first support portion 43 is formed in a shape that conforms to the peripheral face of the inner periphery of the magnetic core 10. In the present embodiment, the penetration portion 31 of the folded-back busbar 30 is shaped as a circular column, the inner periphery of the magnetic core 10 is shaped as a circular arc, and the first support portion 43 has a semi-tubular shape.

On the other hand, the second support portion 44 forms a wall that surrounds the Hall element 20 at a position in the gap portion 12 of the magnetic core 10. Due to the Hall element 20 being fitted into the hole portion of the second support portion 44, the second support portion 44 supports and positions the Hall element 20 at a position in the gap portion 12 of the magnetic core 10. The magnetic core 10 and the Hall element 20 are thus held in a state of not being in contact with each other.

Also, the outer face of the second support portion 44 is in contact with the two end faces of the magnetic core 10. Accordingly, the second support portion 44 additionally functions as a rotation prevention member for restricting rotation of the magnetic core 10 supported to the first support portion 43.

The cover member 42 is attached to the box member 41, which supports the magnetic core 10, the Hall element 20, and the folded-back busbar 30, so as to close the opening of the box member 41 while sandwiching the electronic circuit board 50.

Rotation prevention protruding portions 421 and obstructing plates 422 are formed on the inner face of the cover member 42 so as to protrude in a direction facing the box member 41. As shown in FIG. 6, the rotation prevention protruding portion 421 is a portion that is formed so as to protrude along the first direction (X-axis direction), and restricts rotation of the folded-back busbar 30 upon coming into contact with the extension portions 32 of the folded-back busbar 30, which is supported to the semi-tubular first support portion 43.

Also, the obstructing plate 422 is a plate-shaped portion that is formed so as to protrude along the first direction. As shown in FIGS. 3 and 4, due to the cover member 42 being combined with the box member 41, the obstructing plate 422 blocks the region of the busbar hole 45 in the bottom wall 411 of the box member 41 that excludes the region occupied by the two extension portions 32 fitted into the cutout portions 451.

Also, a notch portion 46, into which the connector 51 mounted on the electronic circuit board 50 fits, is formed in the wall of the box member 41 that opposes the bottom wall 411. Furthermore, board supporting portions 49, which are protruding portions that extend along the first direction, are formed on the inner face of two side walls of the box member 41.

The board supporting portions 49 of the box member 41 support and position the electronic circuit board 50 when they are fitted into the notch portions 501 of the electronic circuit board 50. Also, the electronic circuit board 50 is sandwiched between the box member 41 and the cover member 42 while being supported by the board supporting portions 49, and the connector 51 mounted on the electronic circuit board 50 is fixed in the state of being fitted into the notch portion 46 formed in the box member 41.

Furthermore, the box member 41 and the cover member 42 are provided with lock mechanisms 47 and 48 that hold them in a state where they are combined with each other. The lock mechanisms 47 and 48 shown in FIG. 1 each include a catch portion 47 formed in a protruding manner on a side face of the box member 41, and a ring-shaped frame portion 48 formed on the side of the cover member 42. When the catch portion 47 of the box member 41 is fitted into the hole defined by the frame portion 48 of the cover member 42, the box member 41 and the cover member 42 are held in a state where they are combined with each other.

As shown in FIGS. 2 and 3, the box member 41 and the cover member 42 (insulating casing 40) are combined along the first direction on both sides of the magnetic core 10. Thus, when the box member 41 and the cover member 42 are combined with each other, they cover and support the magnetic core 10, the portion of the folded-back busbar 30 spanning from the penetration portion 31 to a portion of each of the two extension portions 32, and the Hall element 20 in a fixed positional relationship, with a portion of each of the two extension portions 32 of the folded-back busbar 30, the two terminal portions 33, and a portion of the connector 51 of the electronic circuit board 50 being exposed to the outside.

<Procedure for Assembling Current Detection Device 1>

The following describes an example of a procedure for assembling the current detection device 1, with reference to FIGS. 7 to 12.

Figure 7:
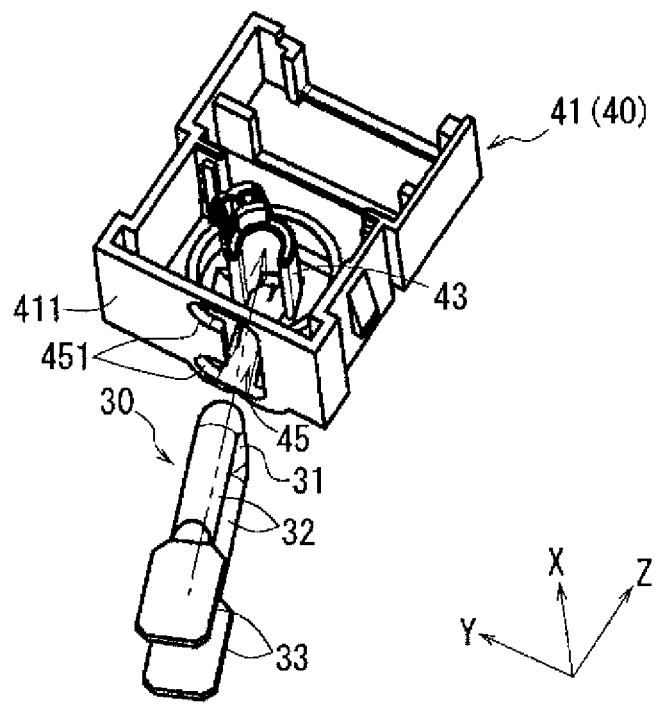
FIG. 7 is a perspective view of the box member and a folded-back busbar before being inserted therein, in the current detection device 1.

FIG. 7 is a perspective view of the box member 41 and the folded-back busbar 30 before being inserted therein, in the current detection device 1. As shown in FIG. 7, the folded-back busbar 30 is inserted along a direction between the second direction and the third direction into the box member 41 through the busbar hole 45 in the bottom wall 411, with the penetration portion 31 at the head.

Figure 8:
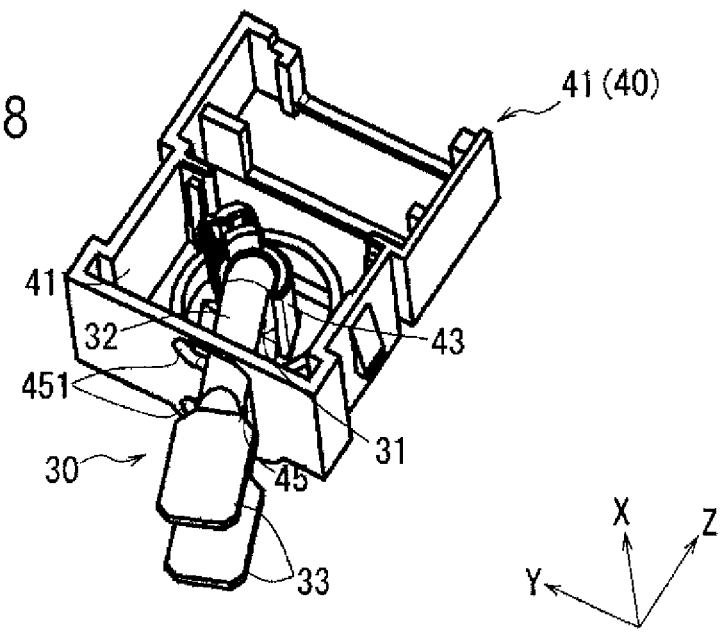
FIG. 8 is a perspective view of the box member and the folded-back busbar inserted therein, in the current detection device 1.

FIG. 8 is a perspective view of the box member 41 and the folded-back busbar 30 inserted therein, in the current detection device 1. As shown in FIG. 8, the penetration portion 31 of the folded-back busbar 30 inserted into the box member 41 is fitted into the semi-tubular first support portion 43 inside the box member 41. Furthermore, with the penetration portion 31 fitted into the first support portion 43, the extension portions 32 of the folded-back busbar 30 are rotated until they extend along the second direction (Z-axis negative direction).

Accordingly, the folded-back busbar 30 is supported by the first support portion 43 at the penetration portion 31.

Figure 9:
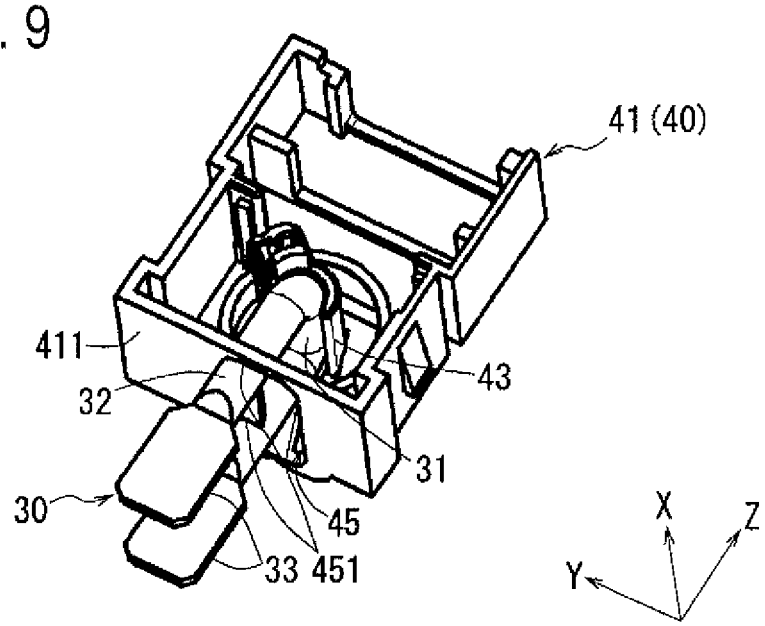
FIG. 9 is a perspective view of the box member and the folded-back busbar supported therein, in the current detection device 1.

FIG. 9 is a perspective view of the box member 41 and the folded-back busbar 30 supported therein, in the current detection device 1. As previously described, the free portions of the side faces of the semi-tubular first support portion 43 are formed so as to face a direction orthogonal to the second direction. In other words, the side walls of the first support portion 43 are formed in a range that spans from at least the second direction to the direction opposite thereto. Accordingly, the first support portion 43 restricts movement of the folded-back busbar 30 in a direction that conforms to the Z-axis direction, that is to say, in the second direction and the direction opposite thereto.

Also, with the folded-back busbar 30 supported to the first support portion 43, the two extension portions 32 of the folded-back busbar 30 are respectively fitted into the two cutout portions 451 in the periphery of the busbar hole 45 formed in the bottom wall 411 of the box member 41.

Figure 10:
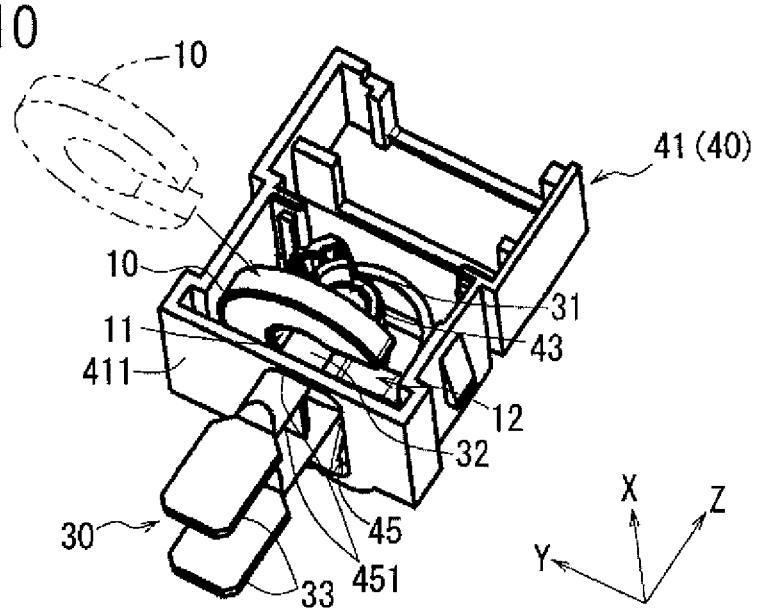
FIG. 10 is a perspective view of the box member, the folded-back busbar supported therein, and a magnetic core through which an extension portion of the folded-back busbar passes, in the current detection device 1.

With the folded-back busbar 30 supported to the first support portion 43, the magnetic core 10 is hooked onto an extension portion 32 of the folded-back busbar 30 inside the box member 41. FIG. 10 is a perspective view of the box member 41, the folded-back busbar 30 supported therein, and the magnetic core 10 through which an extension portion 32 of the folded-back busbar passes, in the current detection device 1. Note that the magnetic core 10 in the state before it is hooked onto the folded-back busbar 30 is depicted with virtual lines (dashed double-dotted lines) in FIG. 10.

As shown in FIG. 10, due to one of the extension portions 32 of the folded-back busbar 30 being inserted into the hole portion 11 through the gap portion 12 of the magnetic core 10, the magnetic core 10 is hooked onto that extension portion 32 of the folded-back busbar 30. As a result, that extension portion 32 of the folded-back busbar 30 passes through the hole portion 11 of the magnetic core 10. In order to allow the above-described hooking, the gap between the two ends of the magnetic core 10 is formed so as to be larger than the thickness of the extension portion 32 of the folded-back busbar 30.

Figure 11:
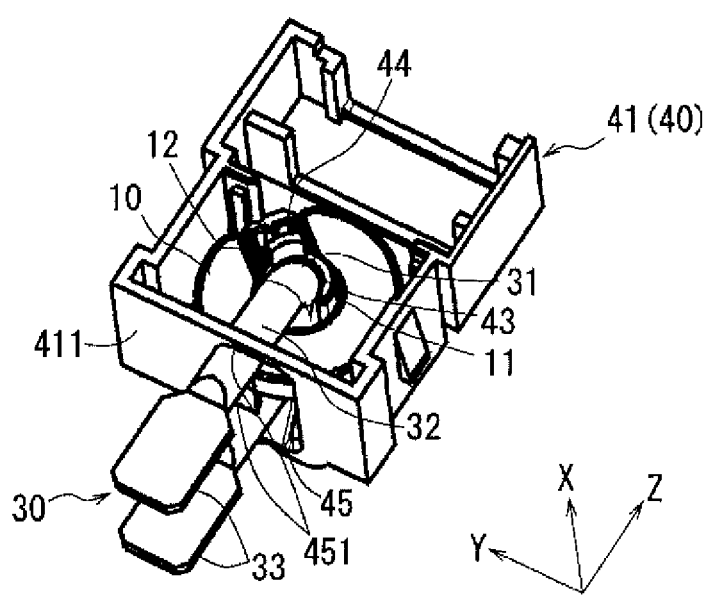
FIG. 11 is a perspective view of the box member and the folded-back busbar and the magnetic core that are supported thereby, in the current detection device 1.

Next, the magnetic core 10 hooked onto the extension portion 32 of the folded-back busbar 30 is rotated and moved from the extension portion 32 toward the penetration portion 31 supported to the first support portion 43. Accordingly, the folded-back busbar 30 and the magnetic core 10 are supported by the semi-tubular first support portion 43. FIG. 11 is a perspective view of the box member 41 and the folded-back busbar 30 and the magnetic core 10 that are supported thereby, in the current detection device 1.

As shown in FIG. 11, due to the magnetic core 10 being moved from the extension portion 32 to the penetration portion 31, the semi-tubular first support portion 43 is inserted into the gap between the inner periphery of the magnetic core 10 and the penetration portion 31 of the folded-back busbar 30 in the hole portion 11 of the magnetic core 10.

Then, when inserted between the inner periphery of the magnetic core 10 and the penetration portion 31, the outer face of the first support portion 43 supports the magnetic core 10, and the inner face supports the folded-back busbar 30. At this time, the first support portion 43 is in close contact with the inner periphery of the magnetic core 10 and the outer periphery of the penetration portion 31 of the folded-back busbar 30, and positions the magnetic core 10 and the folded-back busbar 30.

Specifically, the first support portion 43 supports the magnetic core 10 because the support portion 43 is inserted into the hole portion 11 of the magnetic core 10. The first support portion 43 is sandwiched between the magnetic core 10 and the penetration portion 31 of the folded-back busbar 30. As a result, the magnetic core 10 and the folded-back busbar 30 are held by the first support portion 43 so as to not come into contact with each other.

Next, the Hall element 20 is fitted into the second support portion 44. The board supporting portions 49 of the box member 41 are then passed through the notch portions 501 of the electronic circuit board 50, and the connection terminals 21 of the Hall element 20 are passed through a mounting hole 502 formed in the electronic circuit board 50. The connection terminals 21 of the Hall element 20 are then fixed by soldering to a portion of the mounting hole 502 in the electronic circuit board 50.

Figure 12:
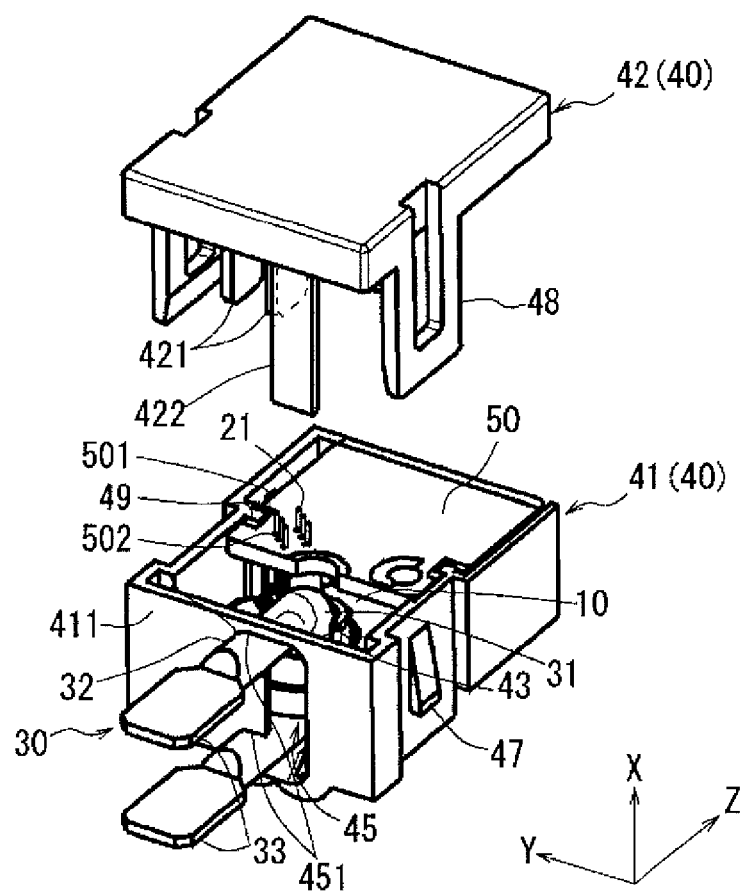
FIG. 12 is a perspective view of the current detection device 1 before a cover member is combined with the box member.

FIG. 12 is a perspective view of the current detection device 1 before the cover member 42 is combined with the box member 41. When the folded-back busbar 30, the magnetic core 10, the Hall element 20, and the electronic circuit board 50 are assembled in the box member 41, the current detection device 1 is in the state shown in FIG. 12.

Lastly, the cover member 42 is attached, along the first direction, to the box member 41 in which the various components are assembled. Accordingly, the pair of rotation prevention protruding portions 421 of the cover member 42 sandwich the extension portions 32 of the folded-back busbar 30. Furthermore, the obstructing plate 422 of the cover member 42 blocks the open region of the busbar hole 45 in the bottom wall 411 of the box member 41. Moreover, the lock mechanisms 47 and 48 hold the box member 41 and the cover member 42 in the state where they are combined with each other.

Figure 13:
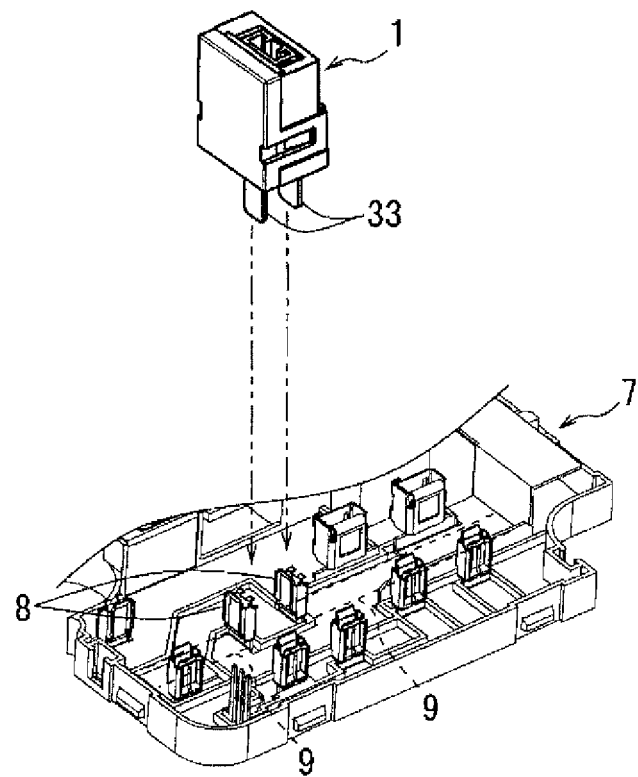
FIG. 13 is a perspective view of an electrical junction box and the current detection device 1 to be attached thereto.

FIG. 13 is a perspective view of an electrical junction box 7 and the current detection device 1 to be attached thereto. As shown in FIG. 13, the two terminal portions 33 of the current detection device 1 are inserted into the connection ports of junction terminals 8 of the anterior and posterior busbars 9 laid out in advance in the electrical junction box 7, which is a power box or the like. Accordingly, the folded-back busbar 30 is electrically connected to the anterior and posterior busbars 9, and fixed inside the electrical junction box 7.

In the example shown in FIGS. 1 to 13, the two terminal portions 33 of the folded-back busbar 30 are formed in the shape of flat plates that conform to two parallel planes. However, the two terminal portions 33 may be formed in the shape of flat plates that conform to two planes that are not parallel.

Figure 14:
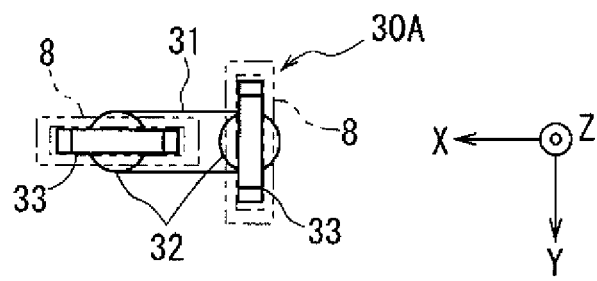
FIG. 14 is a bottom view of a folded-back busbar that is applicable to the current detection device 1.

FIG. 14 is a bottom view of a folded-back busbar 30A that is applicable to the current detection device 1. The junction terminals 8 of the anterior and posterior busbars 9 are depicted with virtual lines (dashed double-dotted lines) in FIG. 14.

In the example shown in FIG. 14, the two terminal portions 33 of the folded-back busbar 30A are formed in the shape of flat plates that conform to two orthogonal planes. More specifically, one of the terminal portions 33 is shaped as a flat plate that is parallel to the X-Z plane, and the other terminal portion 33 is shaped as a flat plate that is parallel to the Y-Z plane.

When the two terminal portions 33 of the folded-back busbar 30A are inserted into the connection ports of the junction terminals 8 of the other busbars 9, the one terminal portion 33 parallel to the X-Z plane is positionally fixed in the Y-axis direction by the one junction terminal 8, and the other terminal portion 33 parallel to the Y-Z plane is positionally fixed in the X-axis direction by the other junction terminal 8.

Accordingly, in the folded-back busbar 30A, error in the relative positions of the two terminal portions 33 in the X-axis direction is absorbed by play of the junction terminal 8 whose connection port is parallel to the X-axis direction. Also, error in the relative positions of the two terminal portions 33 in the Y-axis direction is absorbed by play of the junction terminal 8 whose connection port is parallel to the Y-axis direction.

<Effects>

In the current detection device 1 described above, the two end portions of the folded-back busbar 30 are the terminal portions 33. In other words, in the state of passing through the hole portion 11 of the magnetic core 10, the folded-back busbar 30 can be connected, from the rear, to the anterior and posterior busbars 9 provided in advance. This enables employing an irregular folded-back busbar 30 whose shape is different from that of the anterior and posterior busbars 9, and enables employing a small-sized magnetic core 10 without being constrained by the width of the anterior and posterior busbars 9.

Also, in the folded-back busbar 30, the penetration portion 31 passing through the hole portion 11 of the magnetic core 10 is formed so as to have a larger thickness than the terminal portions 33. Accordingly, the penetration portion 31 can be formed with more surface area while being constrained to having a width and thickness that are smaller than the width of the hole portion 11 of the magnetic core 10. Accordingly, it is possible to prevent excessive heat generation by the folded-back busbar 30 even when employing a relatively small magnetic core 10.

Also, the folded-back busbar 30 form a structure if bar-shaped metal member passes through the hole portion 11 of the magnetic core 10. The end portions of the bar-shaped metal member have a larger width than the other portions of the bar-shaped metal member. In this case, flat plate-shaped terminal portions 33 having a larger width than the width of the hole portion 11 of the magnetic core 10 can be easily formed in the two end portions of the bar-shaped metal member.

Also, the current detection device 1 includes the two terminal portions 33 shaped as flat plates that protrude in the same direction. For this reason, with the simple operation of inserting the two terminal portions 33 into gaps in the two junction terminals 8 provided in advance, the folded-back busbar 30 is electrically connected to the anterior and posterior busbars 9 via the two junction terminals 8, and also fixed to the junction terminals 8. In other words, the attachment task for connecting the current detection device 1 to existing busbars 9 is simple.

Also, the dimension of the current detection device 1 in the first direction (X-axis direction) need only be a small dimension that is approximately the dimension obtained by adding the diameters of the two extension portions 32 of the folded-back busbar 30 to the thickness of the magnetic core 10. Also, the dimension of the current detection device 1 in the third direction (Y-axis direction) need only be a small dimension that is approximately the width of the magnetic core 10.

In other words, the projected surface area of the current detection device 1 in the second direction (Z-axis direction) can be small. Moreover, the current detection device 1 is attached to the junction terminals 8 by merely being inserted into the junction terminal 8 along the second direction, and there is no need for surplus workspace for a screwing-fixing task or the like. Accordingly, employing the current detection device 1 enables reducing the amount of space required for the attachment task.

Also, the constituent components of the current detection device 1 are held in a predetermined positional relationship by the insulating casing 40 that covers everything except the two terminal portions 33 that are to be exposed. Accordingly, the task for attaching the current detection device 1 to the junction terminals 8 provided in advance is very easy and does not require a tool such as a screwdriver. Moreover, the insulating casing 40 prevents the entrance of foreign matter into the gap between the magnetic core 10 and the Hall element 20, thus making it possible to avoid degradation in current detection precision due to the entrance of foreign matter.

Also, in the current detection device 1, the gap between the two ends of the magnetic core 10 is larger than the thickness of each of the two extension portions 32 of the folded-back busbar 30. Furthermore, the insulating casing 40 is composed of the box member 41 and the cover member 42, and the box member 41 is provided with the semi-tubular first support portion and the bottom wall 411 in which the busbar hole 45 is formed. Moreover, the rotation prevention protruding portions 421 are formed on the cover member 42. Due to the current detection device 1 having this configuration, the insulating casing 40 having a relatively simple structure composed of two members makes it possible to cover and position the magnetic core 10 and the folded-back busbar 30.

Note that if a notch portion that is not a through-hole is formed in the bottom wall 411 of the box member 41 as a path for the extension portions 32 of the folded-back busbar 30, it is possible for the magnetic core 10 combined with the folded-back busbar 30 to be installed in the box member 41. However, in this case, the large notch portion 46 for the connector 51 and a large notch portion for the folded-back busbar 30 are formed in the walls forming the box member 41. For this reason, it is difficult to sufficiently ensure the strength of the box member 41.

Also, if the penetration portion 31 of the folded-back busbar 30 is shaped as a circular column, and the first support portion 43 of the box member 41 is semi-tubular, the penetration portion 31 of the folded-back busbar 30 can be smoothly supported to the first support portion 43.

Also, in the current detection device 1, the two cutout portions 451 are formed in portions of the busbar hole 45 in the box member 41, and the obstructing plate 422 is formed on the cover member 42. For this reason, the gap between the insulating casing 40 and the two extension portions 32 of the folded-back busbar 30 is blocked, the entrance of foreign matter into the insulating casing 40 is more reliably prevented, and it is possible to more reliably avoid degradation in current detection precision due to the entrance of foreign matter.

Also, if the two terminal portions 33 are formed in the shape of flat plates that conform to two orthogonal planes as shown in FIG. 14, it is possible to avoid a failure in the connection between the terminal portions 33 and the junction terminals 8 through having dimensional tolerance between the two terminal portions 33 and the junction terminals 8 to which they are to be connected.

<Other Remarks>

In the current detection device 1, the penetration portion 31 of the folded-back busbar 30 may be shaped as a rectangular column, and the inner face of the first support portion 43 may be shaped as a polygon that conforms to the outer shape of the penetration portion 31. For example, it is conceivable for the free portions of the tubular first support portion 43 to face the third direction (Y-axis direction). In this case, even if the penetration portion 31 of the folded-back busbar 30 is shaped as a polygonal column, such as a rectangular column, a hexagonal column, or an octagonal column, the penetration portion 31 can be fitted into the first support portion 43 along the third direction with the two terminal portions 33 facing the second direction (Z-axis negative direction).

Also, in the current detection device 1, the magnetic core 10 may be formed with a shape other than a circular ring, one example of which is a polygonal ring such as a rectangular ring.

Also, in the current detection device 1, the two terminal portions 33 may be formed in the shape of flat plates that conform to two parallel planes or two orthogonal planes, or may be formed in the shape of flat plates that conform to two planes that intersect at an angle other than 90°.

The invention claimed is:

1. A current detection device comprising:
   a magnetic core that is made of a magnetic material and is formed in one piece so as to define a hole portion and a gap portion, the magnetic core having two ends facing each other across the gap portion;
   a magneto-electric conversion element that is disposed in the gap portion of the magnetic core and detects magnetic flux that changes in accordance with current flowing through the hole portion of the magnetic core; and
   a current detection busbar that is made of a conductor and passes through the hole portion of the magnetic core,
   wherein the current detection busbar is formed in an overall U-shape, and has:
      a bar-shaped penetration portion that passes through the hole portion of the magnetic core along a first direction;
      two bar-shaped extension portions that are respectively continuous with front and back sides of the penetration portion in the first direction, and extend parallel to a second direction that is orthogonal to the first direction; and
      two terminal portions that are respectively continuous with the two extension portions on sides in the second direction, and are shaped as flat plates having a larger width than the penetration portion and the extension portions.

2. The current detection device according to claim 1, further comprising:
   an insulating casing that is made of an insulating material, covers the magnetic core, the magneto-electric conversion element, the penetration portion, and a portion of each of the two extension portions of the current detection busbar,
   the two terminal portions extending outside of the insulating casing;
   the insulating casing supporting the magnetic core, the magneto-electric conversion element, and the current detection busbar in a fixed positional relationship.

3. The current detection device according to claim 2,
   wherein the gap portion is larger than a thickness of each of the two extension portions of the current detection busbar,
   the insulating casing further includes a box member having an opening formed in the first direction, and a cover member that closes the opening of the box member when combined with the box member,
   the box member includes:
      a bottom wall that forms a wall on an end in the second direction, the bottom wall formed in one piece so as to define a through-hole into which the current detection busbar can be inserted; and
      a semi-tubular support portion that is positioned with the first direction as an axial direction, and wherein the semi-tubular support portion supports the magnetic core with an outer face and supports the current detection busbar with an inner face inserted between an inner periphery of the magnetic core and the penetration portion of the current detection busbar in the hole portion of the magnetic core, and a rotation prevention protruding portion is formed on the cover member so as to protrude along the first direction, the rotation prevention protruding portion restricting rotation of the current detection busbar upon coming into contact with an extension portion of the current detection busbar supported by the semi-tubular support portion.

4. The current detection device according to claim 3, wherein the penetration portion of the current detection busbar is shaped as a circular column, and the semi-tubular support portion of the box member is shaped as a semicircular tube.

5. The current detection device according to claim 3, wherein the through-hole defines two cutout portions formed in a periphery of the through-hole in the bottom wall of the box member that are recessed in a third direction that is orthogonal to the first direction and the second direction and respectively allow the two extension portions of the current detection busbar to be fitted therein, and an obstructing plate is formed on the cover member so as to protrude along the first direction, the obstructing plate blocking a region of the through-hole in the bottom wall of the box member that excludes a region occupied by the two extension portions fitted into the cutout portions.

6. The current detection device according to claim 1, wherein the two terminal portions are shaped as flat plates that conform to two orthogonal planes.

7. The current detection device according to claim 1, wherein the current detection busbar is formed by two end portions of a bar-shaped metal member passing through the hole portion of the magnetic core, the two end portions being flattened by press processing so as to be shaped as flat plates having a larger width than other portions, and the two flattened end portions constitute the two terminal portions.

8. A current detection device comprising:
a U-shaped current detection busbar, including:
   a cylindrical penetration portion;
   two cylindrical extension portions extending in a symmetrical arrangement from opposite ends of the cylindrical penetration portion; and
   two terminal portions, each of the terminal portions connected to one of the two cylindrical extension portions, wherein the terminal portions have a larger width than the extension portions;
a magneto-electric conversion element that detects magnetic flux changes; and
a magnetic core defining a hole and a gap,
wherein the cylindrical penetration portion is disposed in the hole, the two terminal portions are disposed outside of the hole and the magneto-electric conversion element is disposed in the gap.

9. The current detection device of claim 8, wherein each of the two terminal portions has a width equal to or greater than a width of the hole.

* * * * *